(12) United States Patent
Jung et al.

(10) Patent No.: US 7,799,625 B2
(45) Date of Patent: Sep. 21, 2010

(54) ORGANIC ELECTRO-LUMINESCENT DISPLAY AND METHOD OF FABRICATING THE SAME

(75) Inventors: Ji-sim Jung, Yongin-si (KR); Jong-man Kim, Yongin-si (KR); Jang-yeon Kwon, Yongin-si (KR); Kyung-bae Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 438 days.

(21) Appl. No.: 11/856,251

(22) Filed: Sep. 17, 2007

(65) Prior Publication Data

US 2008/0067520 A1 Mar. 20, 2008

(30) Foreign Application Priority Data

Sep. 19, 2006 (KR) .................... 10-2006-0090467

(51) Int. Cl.
*H01L 21/84* (2006.01)
(52) U.S. Cl. ................. 438/166; 257/E21.561; 438/275
(58) Field of Classification Search ......... 438/151–166, 438/275; 257/21.561
See application file for complete search history.

(56) References Cited

U.S. PATENT DOCUMENTS 7,411,572 B2 * 8/2008 Choi ........................ 345/80
7,557,412 B2 * 7/2009 Kasahara et al. ........... 257/347
7,588,976 B2 * 9/2009 Makimura et al. .......... 438/166

FOREIGN PATENT DOCUMENTS

JP     2002156923     5/2002

OTHER PUBLICATIONS

R.M.A. Dawson et al.; "Design of an Improved Pixel for a Polysilicon Active-Matrix Organic LED Display"; ISSN0098-0966X/98/2901(c) 1998 SID.
Tatsuya Sasaoka et al.; "Late News Paper: A 13.0-inch AM-OLED Display with Top Emitting Structure and Adaptive Current Mode Programmed Pixel Circuit (TAC)"; SID 01 Digest, 2001, p. 384-387.

* cited by examiner

*Primary Examiner*—Richard A. Booth
(74) *Attorney, Agent, or Firm*—Cantor Colburn LLP

(57) ABSTRACT

An organic electro-luminescent display and a method of fabricating the same include an organic light emitting diode, a driving transistor which drives the organic light emitting diode, and a switching transistor which controls an operation of the driving transistor, wherein active layers of the switching and driving transistors are crystallized using silicides having different densities such that the active layer of the driving transistor has a larger grain size than the active layer of the switching layer.

6 Claims, 20 Drawing Sheets

Ni DEPOSITION

HEATING(FURNACE)

Grain size ~200um

Grain size ~10um p-Si PATTERNING

SiO₂ DEPOSITION (GATE INSULATOR)

Mo or W DEPOSITION & PATTERNING (GATE)

P+ ION INJECTION

ILD DEPOSITION & MAKING CONTACT HOLES

METAL DEPOSITION & PATTERNING

SiO₂ DEPOSITION AND PATTERNNING

ANODE FORMATION

HTL DEPOSITION

ETL/EM DEPOSITION

ORGANIC ELECTRO-LUMINESCENT DISPLAY AND METHOD OF FABRICATING THE SAME

This application claims priority to Korean Patent Application No. 10-2006-0090467, filed on Sep. 19, 2006, and all the benefits accruing therefrom under 35 U.S.C. §119, the contents of which in its entirety are herein incorporated by reference.

BACKGROUND OF THE INVENTION

1. Field of the Invention

The present invention relates to an active matrix thin film transistor ("TFT") organic light emitting diode ("OLED") display and a method of fabricating the same. More particularly, the present invention relates to an OLED having low leakage current, improved response time, simple structure, and high reliability, and a method of fabricating the same.

2. Description of the Related Art

In general, an active color image display device using an OLED includes a switching (sampling) transistor, a memory capacitor, and a driving transistor which controls a current supplied to the OLED according to an image signal voltage applied to the memory capacitor. A specific example of related art is a two transistors-one capacitor ("2T-1C") structure disclosed in Japanese Patent Laid-Open Gazette No. 2002-156923.

Channels for the switching and the driving transistors are generally formed of amorphous silicon ("a-Si") or polycrystalline silicon ("POLY-Si" or "p-Si"). The switching transistor is a switching element which supplies a data voltage to the driving transistor and thus requires a low leakage voltage and fast response. The driving transistor supplies a current to an OLED and thus requires high reliability while sustaining a high current for a long period of time.

Amorphous silicon has low electron mobility which degrades high-speed operation, making amorphous silicon unattractive for use as a material which forms the switching transistor. In addition, amorphous silicon abruptly degrades under high current operation. Thus, amorphous silicon is not suitable as a material for forming the driving transistor.

In contrast, polycrystalline silicon has high electron mobility, providing improved high speed performance. Polycrystalline silicon is also considerably less susceptible than amorphous silicon to degradation under high current. Thus, polycrystalline silicon is preferred to amorphous silicon as a material which forms the switching and driving transistors.

Unfortunately, polycrystalline silicon generates an off-current due to a leakage of a current through grain boundaries. Furthermore, polycrystalline silicon has low crystal line uniformity which makes it difficult to obtain a uniform operating characteristic for each pixel. To compensate for the low crystal line uniformity of polycrystalline silicon, a voltage program type compensation device (e.g., as made by Sarnoff, SID 98), a current program type compensation device (e.g., as made by Sony, SID 01), or other similar device is required. Such compensation devices require complicated circuits which are difficult to design and manufacture. Such compensation devices also introduce new problems.

Therefore, it is desirable to develop an organic electro-luminescent display having advantages of low leakage current, fast response time, simple structure, and high reliability without requiring the use of compensating circuits or other similar devices.

BRIEF SUMMARY OF THE INVENTION

According to one exemplary embodiment of the present invention, an organic electro-luminescent display includes an OLED, a driving transistor which drives the OLED, and a switching transistor which controls an operation of the driving transistor, wherein active layers of the switching and driving transistors are crystallized using silicides having different densities such that the active layer of the driving transistor has a larger grain size than the active layer of the switching layer.

A method of fabricating an organic electro-luminescent display according to one exemplary embodiment of the present invention includes forming an amorphous silicon layer on a substrate, forming silicide having a relatively lower density in an area corresponding to the driving transistor than in an area corresponding to the switching transistor on the amorphous silicon layer, crystallizing the amorphous silicon layer using the silicide to form a polycrystalline silicon layer having a relative larger grain size in the area corresponding to the driving transistor than in the area corresponding to the switching transistor, patterning the polycrystalline silicon layer to form silicon islands corresponding to active layers of the switching and driving transistors, and fabricating the switching and driving transistors using the silicon islands.

According to another exemplary embodiment of the present invention, a method of fabricating an organic electro-luminescent display includes forming a capping layer the amorphous silicon layer to cover at least the area corresponding to the driving transistor, adhering metal particles to the resultant structure, diffusing the metal particles into the amorphous silicon layer using annealing to form the silicide, and crystallizing the amorphous silicon layer using the silicide.

Alternatively, the capping layer may cover the areas corresponding to the driving transistor and the switching transistor. In such an exemplary embodiment, the capping layer is thicker in the area corresponding to the driving transistor than in the area corresponding to the switching transistor.

The silicide may be made of nickel.

BRIEF DESCRIPTION OF THE DRAWINGS

The above and other aspects, features and advantages of the present invention will become more apparent by describing in further detail exemplary embodiments thereof with reference to the accompanying drawings, in which.

DETAILED DESCRIPTION OF THE INVENTION

Figure 1A:
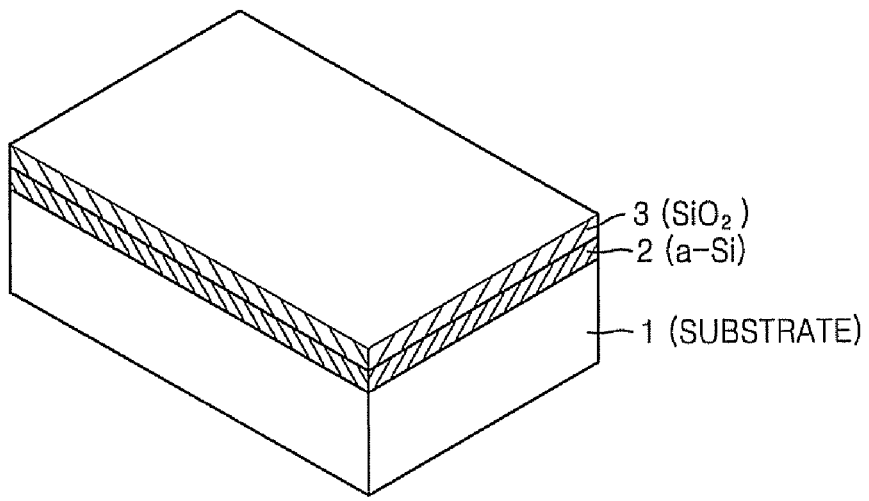
FIGS. 1A through 1C are perspective views illustrating a method of crystallizing amorphous silicon using metal induced crystallization ("MIC") according to one exemplary embodiment of the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, an organic electro-luminescent display and method of fabricating the same according to one exemplary embodiment of the present invention will be described in further detail with reference to the accompanying drawings.

Figure 1B:
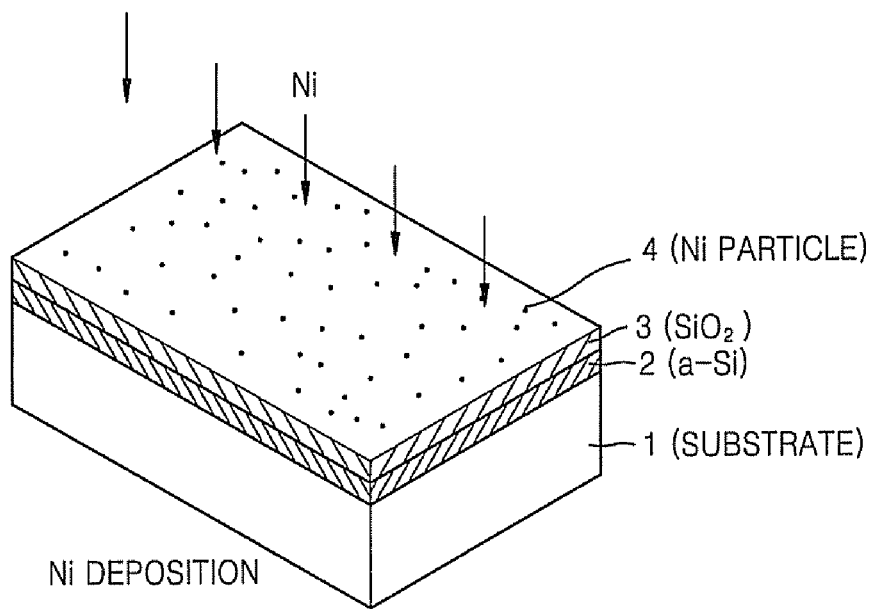
Figure 1C:
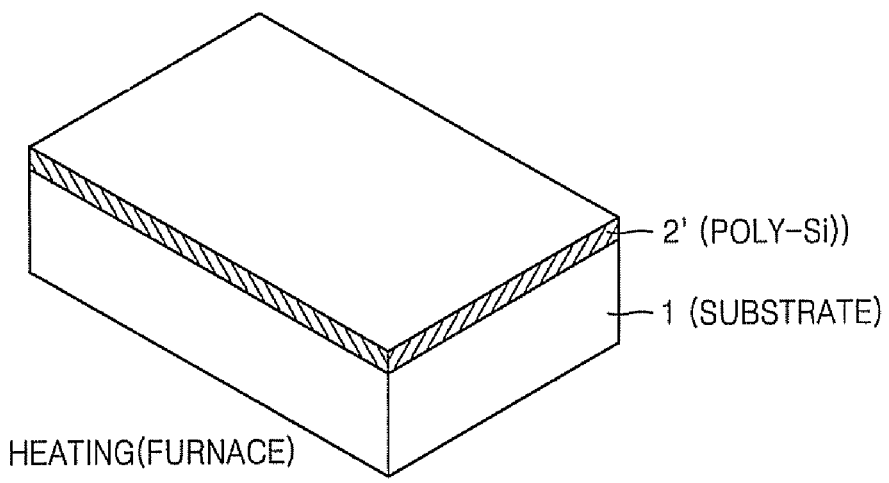

FIGS. 1A through 1C are perspective views illustrating a method of crystallizing amorphous silicon using a metal induced crystallization in a method of fabricating an organic electro-luminescent display according to one exemplary embodiment of the present invention.

Referring to FIG. 1A, an amorphous silicon layer 2 and a capping layer 3 made of silicon dioxide ("$SiO_2$") or other suitable material are sequentially formed on a substrate 1.

Referring to FIG. 1B, nickel (Ni) particles 4 are sputtered on the capping layer 3. Alternatively, the nickel particles may be dispersed in an organic solvent and adhered to the capping layer 3.

Referring to FIG. 1C, polycrystalline silicon 2' is crystallized by thermal treatment with heat from a furnace, and the capping layer 3 on the polycrystalline silicon 2' is removed.

Further referring to FIG. 1, when a catalytic metal such as nickel (or other suitable material) is deposited on the capping layer 3 and is thermally treated, the catalytic metal deposited on the capping layer 3 is diffused into the amorphous silicon through the capping layer 3 and forms nickel silicide. Nickel silicide diffused into the amorphous silicon layer has a crystalline structure and lattice parameter which are the same as silicon and thus operates as a crystallization nucleus in the amorphous silicon, and a grain size of silicon crystal crystallized by the silicide is controlled by an amount of the nickel diffused into the amorphous silicon. Thus, amounts of the nickel silicide may be adjusted according to desired grain sizes which will act as active layers of a switching transistor and a driving transistor. The amount of the nickel silicide is determined by adjusting a thickness of the capping layer 3 formed on the amorphous silicon to adjust a density of the nickel diffused into the amorphous silicon.

Figure 2A:
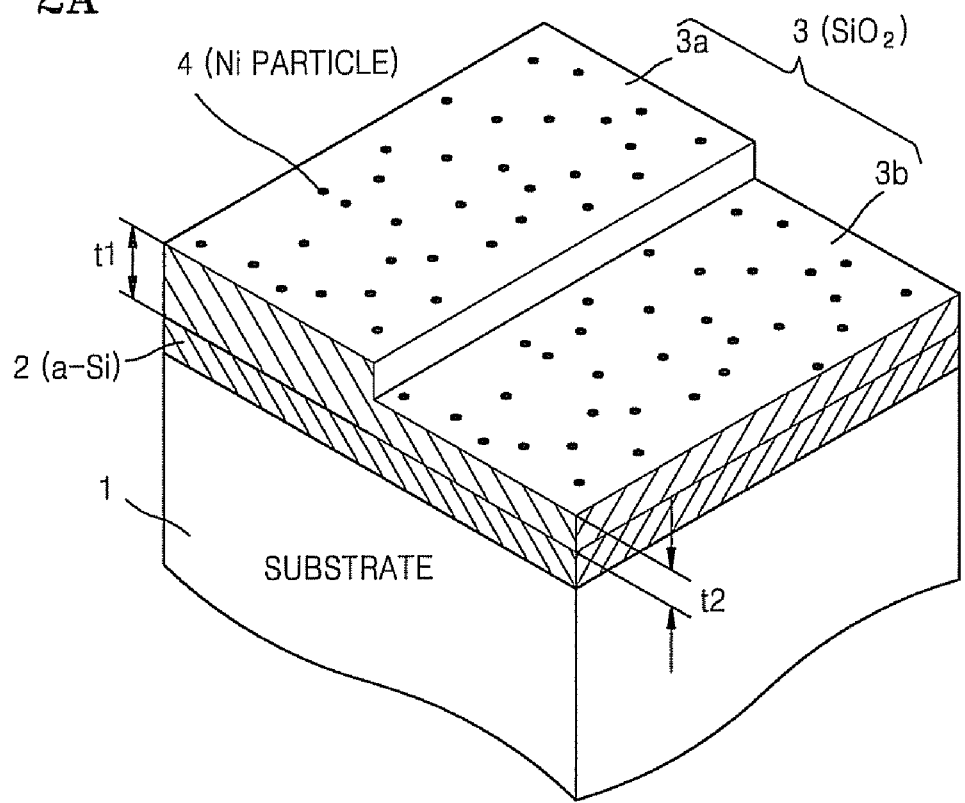
FIGS. 2A and 2B are perspective views illustrating a method of forming silicide using a differential metal diffusion according to one exemplary embodiment of the present invention as illustrated in the method of FIG. 1.
Figure 2B:
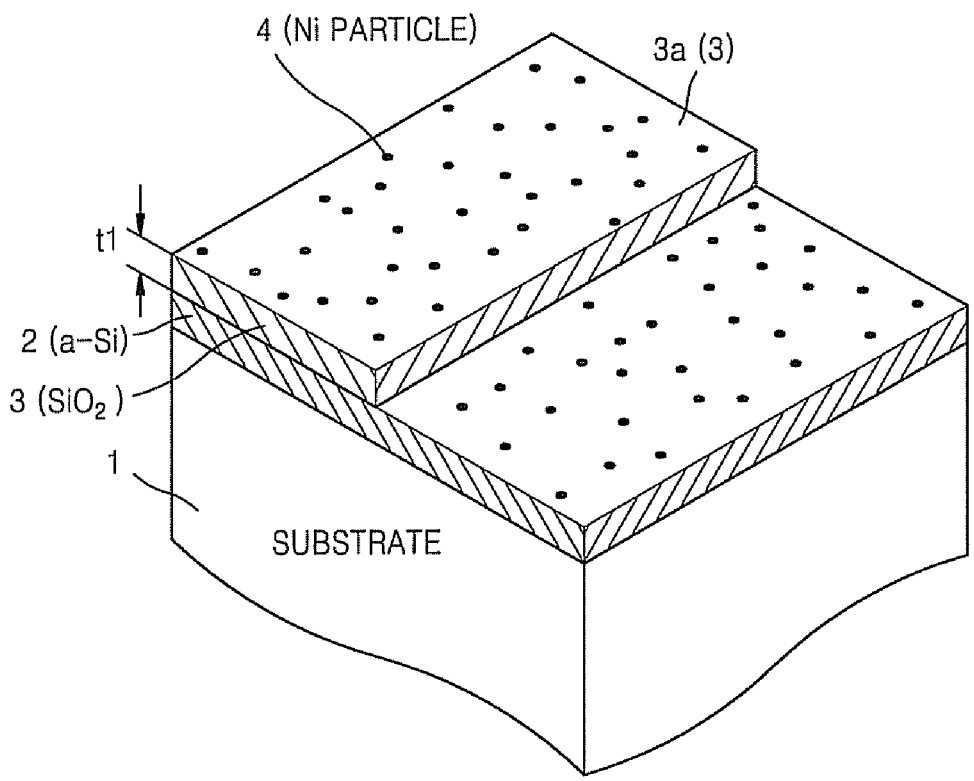

FIGS. 2A and 2B are perspective views illustrating a method of forming silicide using a differential metal diffusion according to one exemplary embodiment of the present invention as illustrated in the method of FIG. 1

Referring to FIG. 2A, the capping layer 3 having a thick part 3a and a thin part 3b is formed on the amorphous silicon layer 2. A lower portion of the thick part 3a of the capping layer 3 is in a location at which the driving transistor is to be formed, and the thin part 3b of the capping layer 3 is in a location at which the switching transistor is to be formed. Alternatively, the thin part 3b of the capping layer 3 may be omitted from the location at which the switching transistor is to be formed, as shown in FIG. 2B. In other words, the capping layer 3 may be formed only in an area on the amorphous silicon layer 2 at which a driving transistor is to be formed. A thickness t1 of the thick part 3a of the capping layer 3 and a thickness t2 of the thin part 3b of the capping layer 3 satisfy an inequality "t2>t1≧0."

FIGS. 3A through 3F are cross-sectional views illustrating a method of crystallizing amorphous silicon according to one exemplary embodiment of the present invention.

Figure 3A:
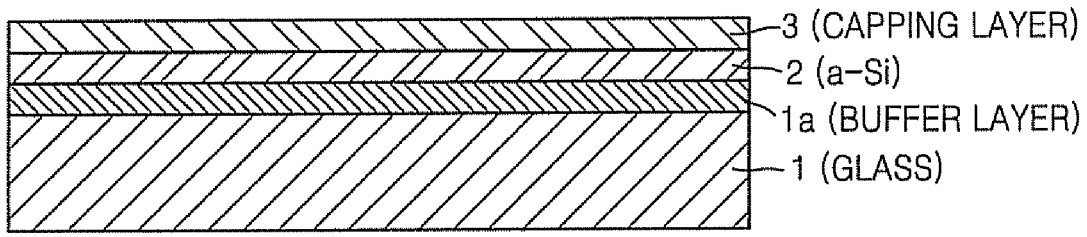
FIGS. 3A through 3F are cross-sectional views illustrating a method of crystallizing amorphous silicon according to one exemplary embodiment of the present invention.

Referring to FIG. 3A, $SiO_2$ or other suitable material is deposited on a substrate 1 formed of glass or other suitable material to form a buffer layer 1a. An amorphous silicon layer 2 and a capping layer 3 are formed on the buffer layer 1a using a well-known method.

Figure 3B:
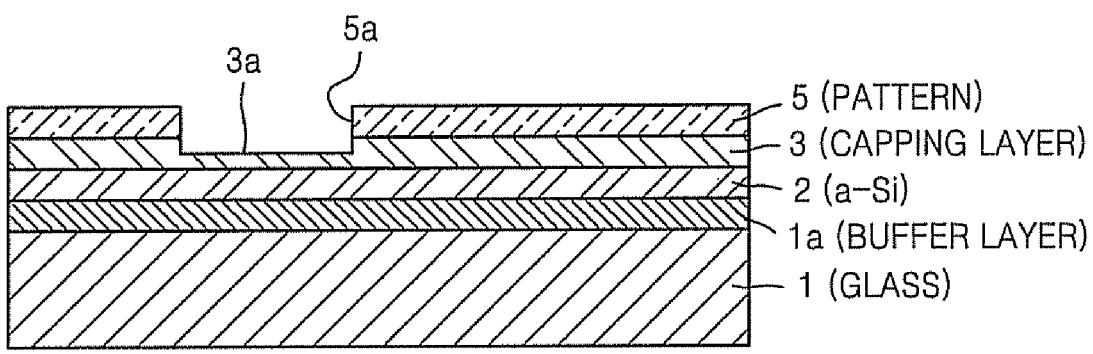

Referring to FIG. 3B, a mask pattern 5 having a window 5a is formed on the capping layer 3, wherein a thin part 3a of the capping layer 3 is processed through the window 5a. Next, a portion of the capping layer 3 exposed through the window 5a is etched.

Figure 3C:
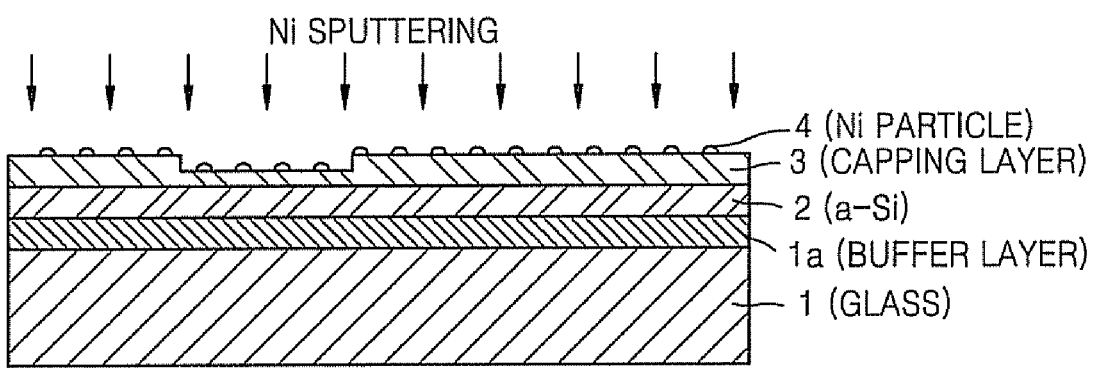

Referring to FIG. 3C, the mask pattern 5 is removed, and nickel is sputtered on the capping layer 3. In FIG. 3. the nickel is shown as being deposited on the capping layer 3 in a particle form.

Figure 3D:
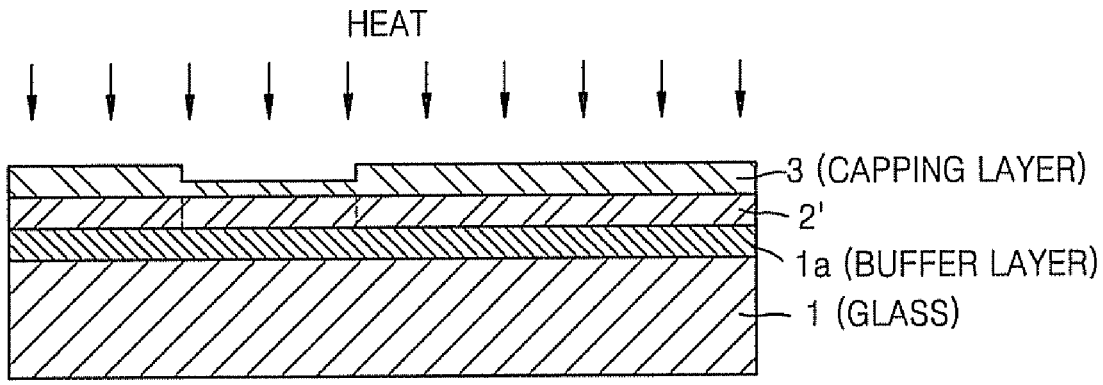

Referring to FIG. 3D, an annealing process which uses heat transforms the amorphous silicon layer 2 into polycrystalline silicon 2'. In the annealing process, the nickel deposited on the capping layer 3 is diffused into the amorphous silicon layer 2 through the capping layer 3 and forms a silicide material which contributes to crystallizing the amorphous silicon layer 2, thereby transforming the amorphous silicon layer 2 into the polycrystalline silicon layer 2'.

Figure 3E:
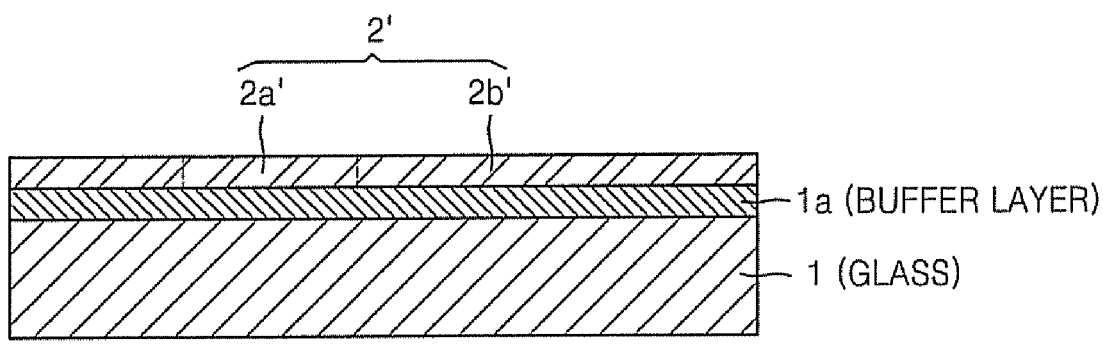

Referring to FIG. 3E, the capping layer 3 on the polycrystalline silicon layer 2' is removed, and the polycrystalline silicon layer 2' is used in the method which fabricates the organic electro-luminescent display according to one exemplary embodiment of the present invention. The polycrystalline silicon layer 2' includes a portion 2a' which is used as the active layer of the switching transistor and a portion 2b' which is used as the active layer of the driving transistor. The portion 2b' which corresponds to the driving transistor has a larger grain size than the portion 2a' which corresponds to the switching transistor.

Figure 3F:
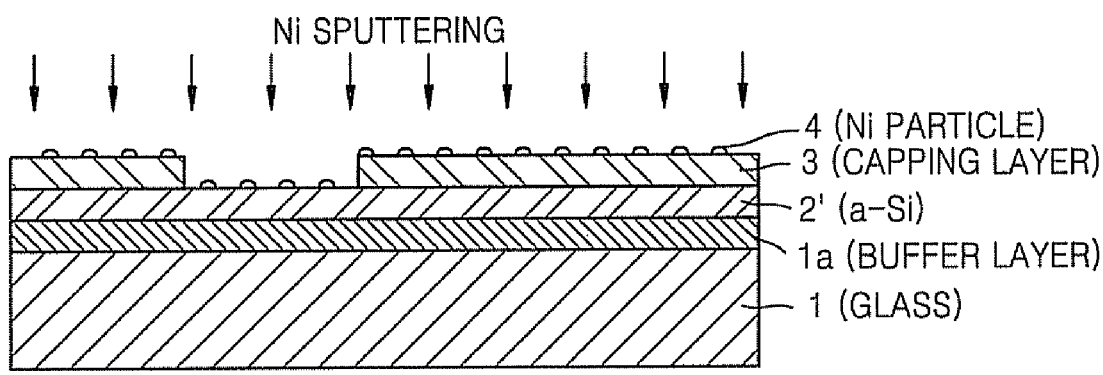

Referring to FIG. 3F, the differential diffusion of the nickel may be obtained by removing the portion 3a (shown in FIG. 3B) to directly deposit the nickel in the area of the amorphous silicon layer requiring polycrystalline silicon having the relatively small grain size.

For any method of differential diffusion, the sputtering of the nickel may be replaced with dispersing of nickel particles into an organic solvent and adhering the nickel to the capping layer 3.

Figure 4A:
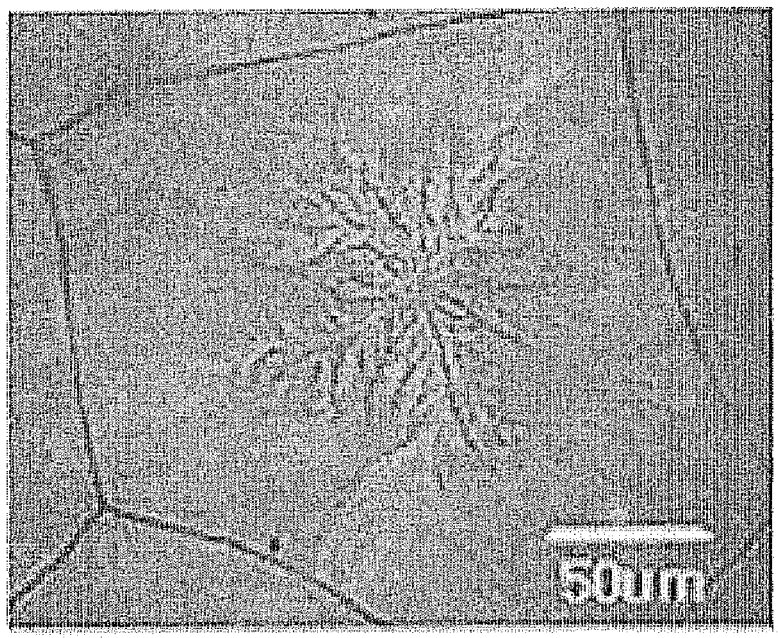
FIGS. 4A and 4B are scanning electron microscopy ("SEM") images illustrating differentially crystallized polycrystalline silicon layers according to exemplary embodiments of the present invention.
Figure 4B:
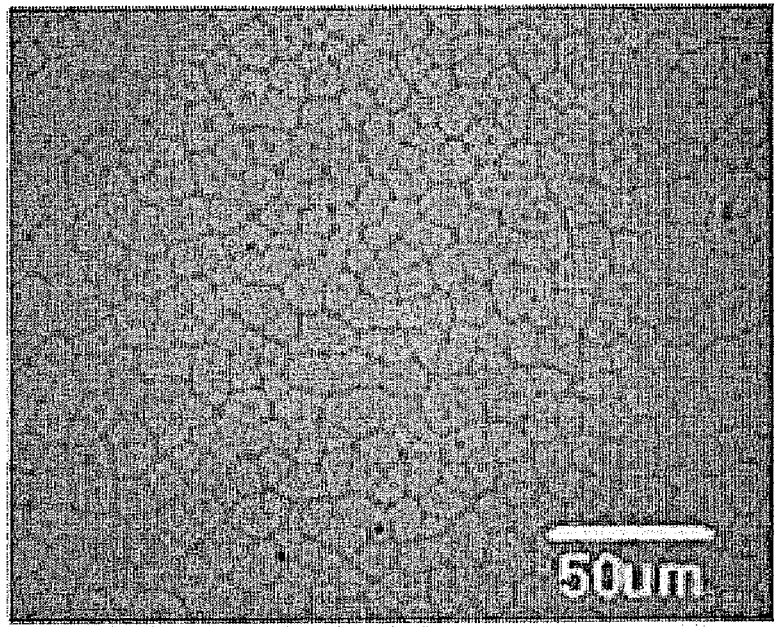

FIGS. 4A and 4B are scanning electron microscopy images of differentially crystallized polycrystalline silicon layers according to exemplary embodiments of the present invention. FIG. 4A illustrates a polycrystalline silicon layer having a grain size of approximately 200 microns and FIG. 4B illustrates a polycrystalline silicon layer having a grain size of approximately 10 microns.

Hereinafter, a method of fabricating an organic electro-luminescent display having a switching transistor and a driving transistor formed of polycrystalline silicon layers which have different grain sizes according to one exemplary embodiment of the present invention will be described in further detail with reference to the accompanying drawings.

Figure 5A:
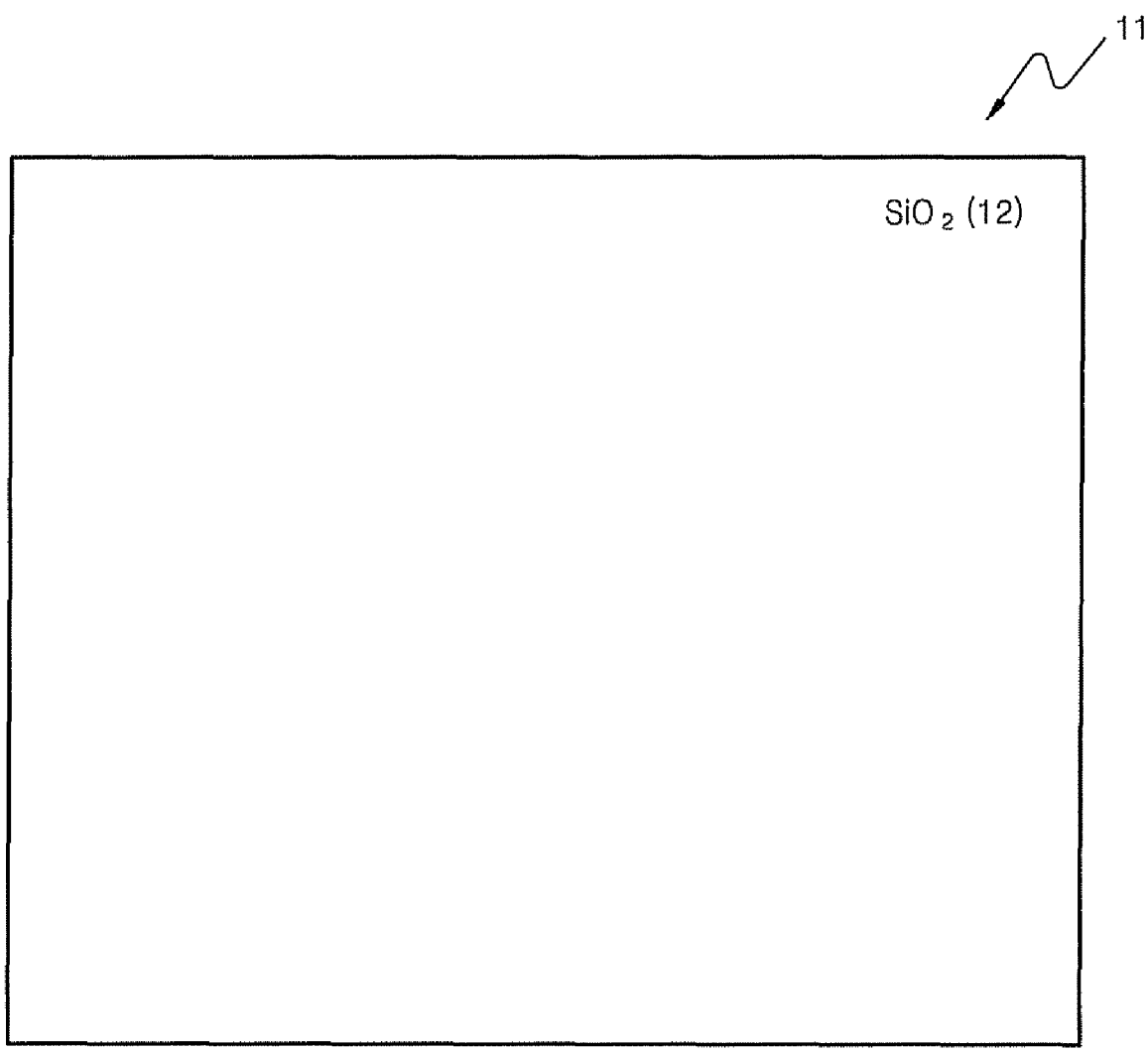
FIGS. 5A through 5O are plan views illustrating a method of fabricating an organic electro-luminescent display according to one exemplary embodiment of the present invention.

FIGS. 5A through 5O are plan views illustrating a method of fabricating an organic electro-luminescent display according to one exemplary embodiment of the present invention. Referring to FIG. 5A, a buffer layer 12 formed of $SiO_2$ is formed on a substrate 11 formed of quartz, glass, plastic, or other suitable material.

Figure 5B:
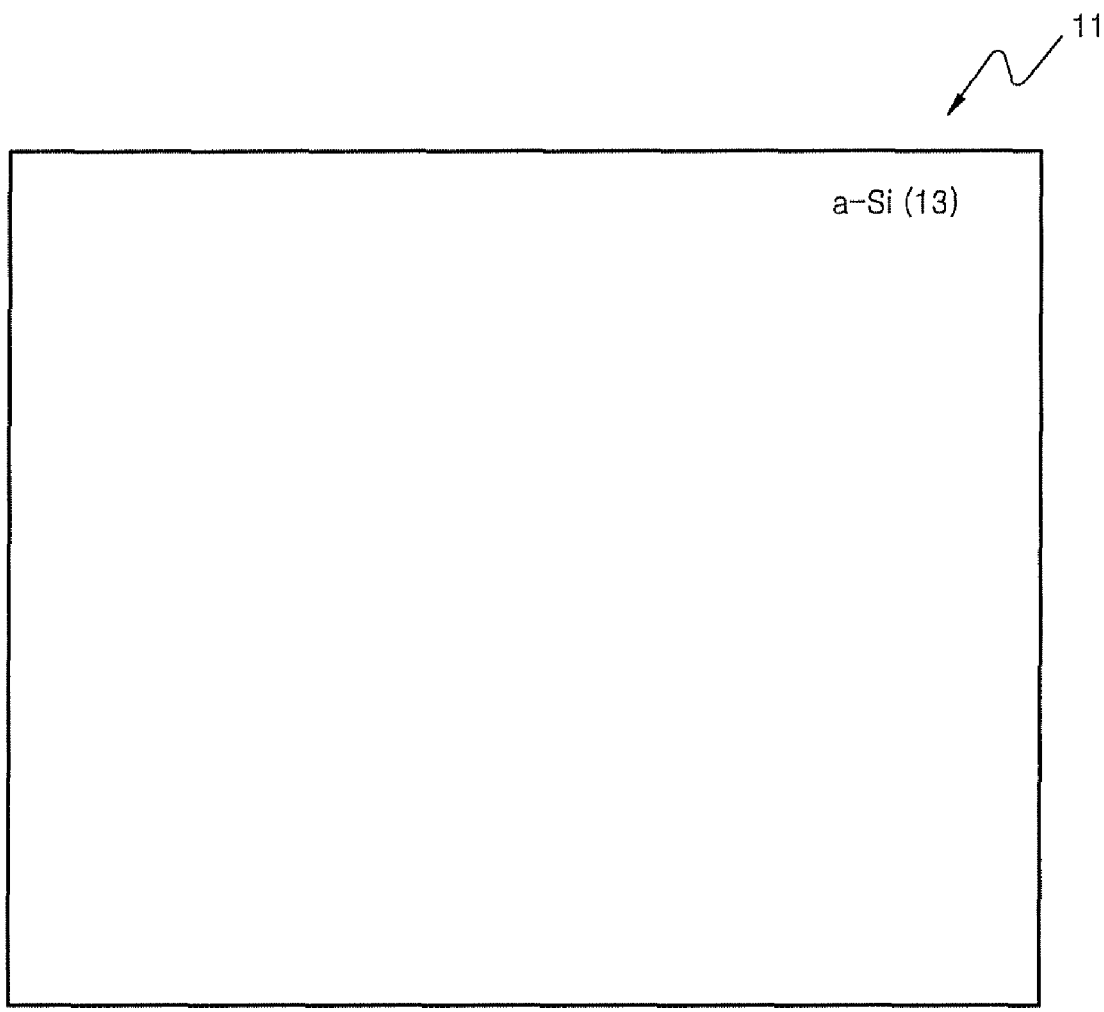

Referring to FIG. 5B, an amorphous silicon layer 13 is formed to a thickness of about 500 Å on the buffer layer 12. The amorphous silicon layer 13 is deposited using chemical vapor deposition ("CVD") or physical vapor deposition ("PVD"), preferably PVD. The PVD process may include silicon as a sputtering target, argon gas at a rate of about 50 standard cubic centimeters per minute, and an atmospheric pressure of about 5 mTorr.

Figure 5C:
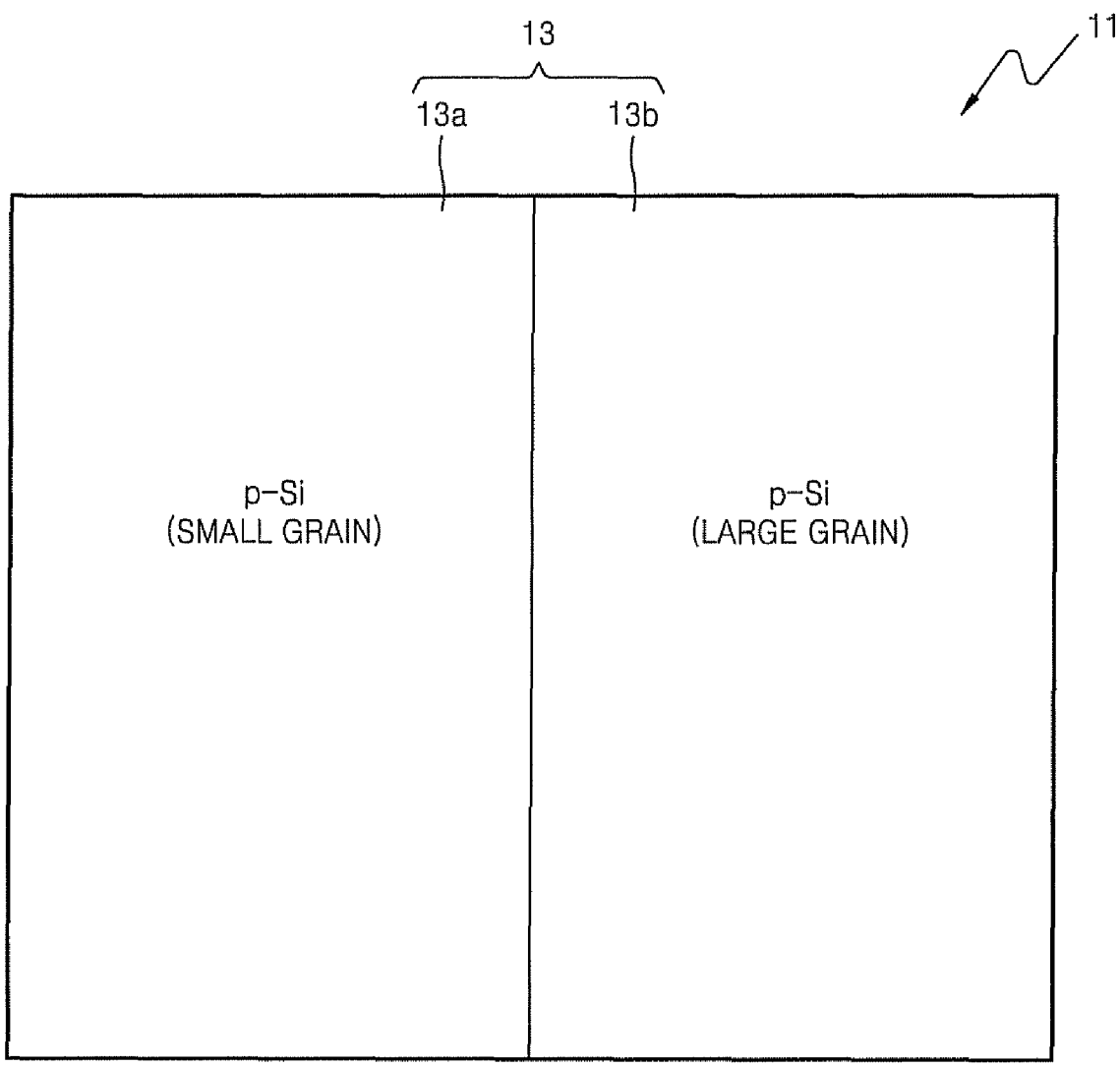

Referring to FIG. 5C, the amorphous silicon layer 13 is crystallized by silicide formed through a differentiated diffusion of nickel as described herein to form a polycrystalline silicon part 13a having a small grain size and a polycrystalline silicon part 13b having a large grain size. This process may be the method described in accordance with one exemplary embodiment of the present invention with reference to FIGS. 3A through 3E.

Figure 5D:
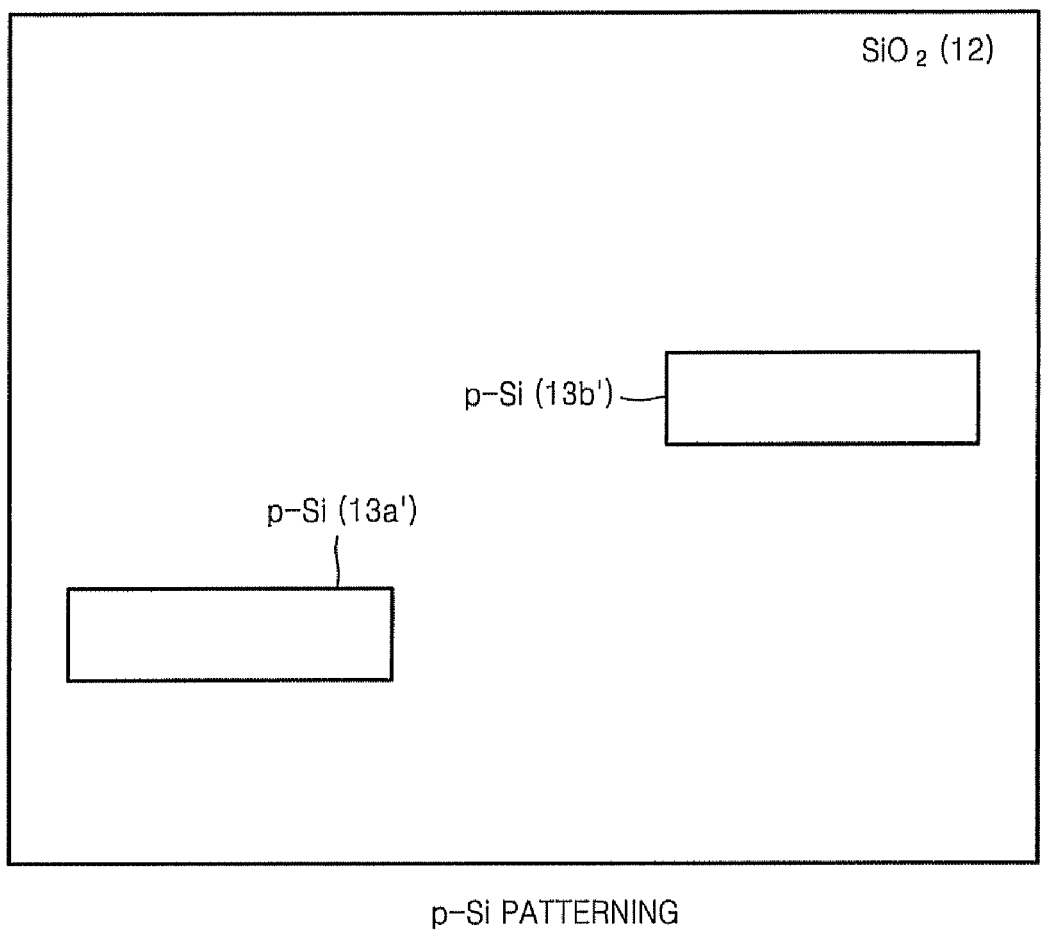

Referring to FIG. 5D, the polycrystalline silicon parts 13a and 13b are patterned using a well-known method such as a dry etching method or other suitable method to obtain silicon islands 13a' and 13b' which are to be used as switching and driving transistors, respectively. Widths of the silicon islands 13a' and 13b' are set to approximately 4 microns and their lengths are set to approximately 4 microns or more.

Figure 5E:
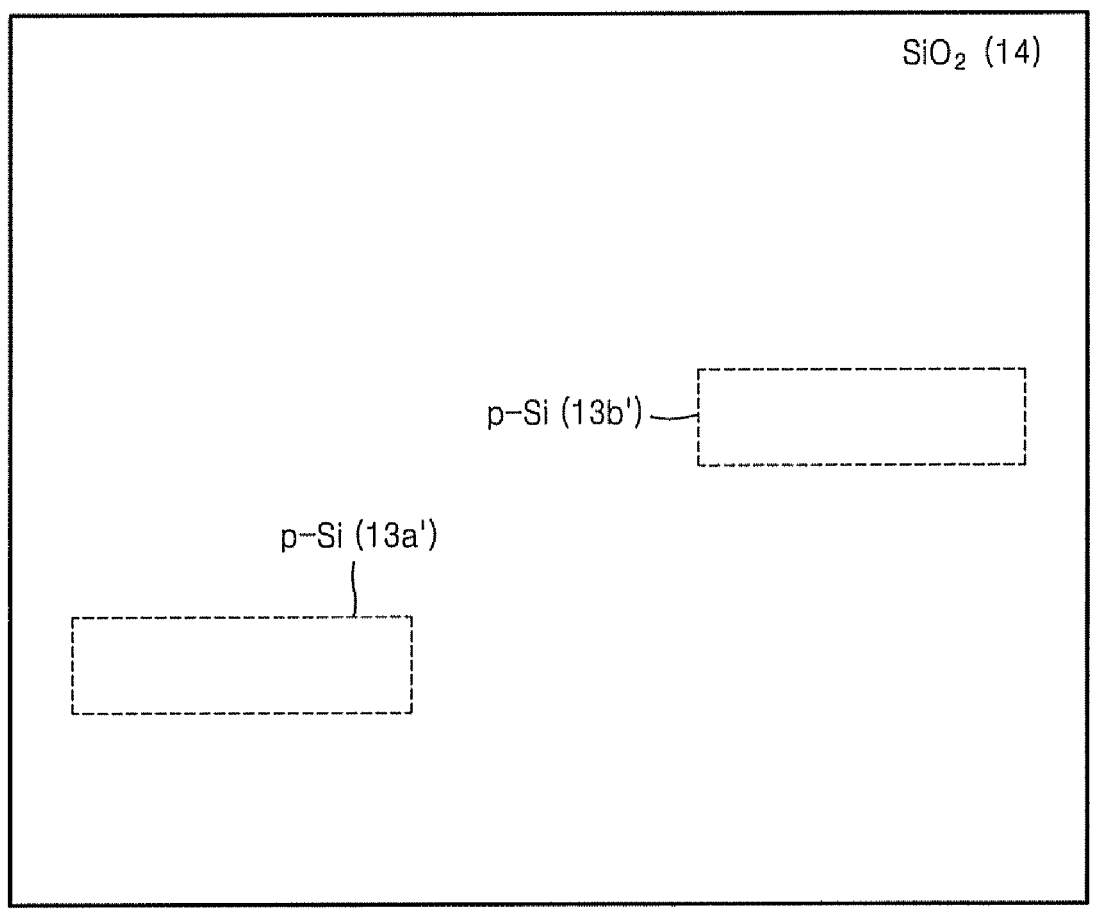

Referring to FIG. 5E, a gate insulating layer 14 made of $SiO_2$ is formed to cover the silicon islands 13a' and 13b'.

Figure 5F:
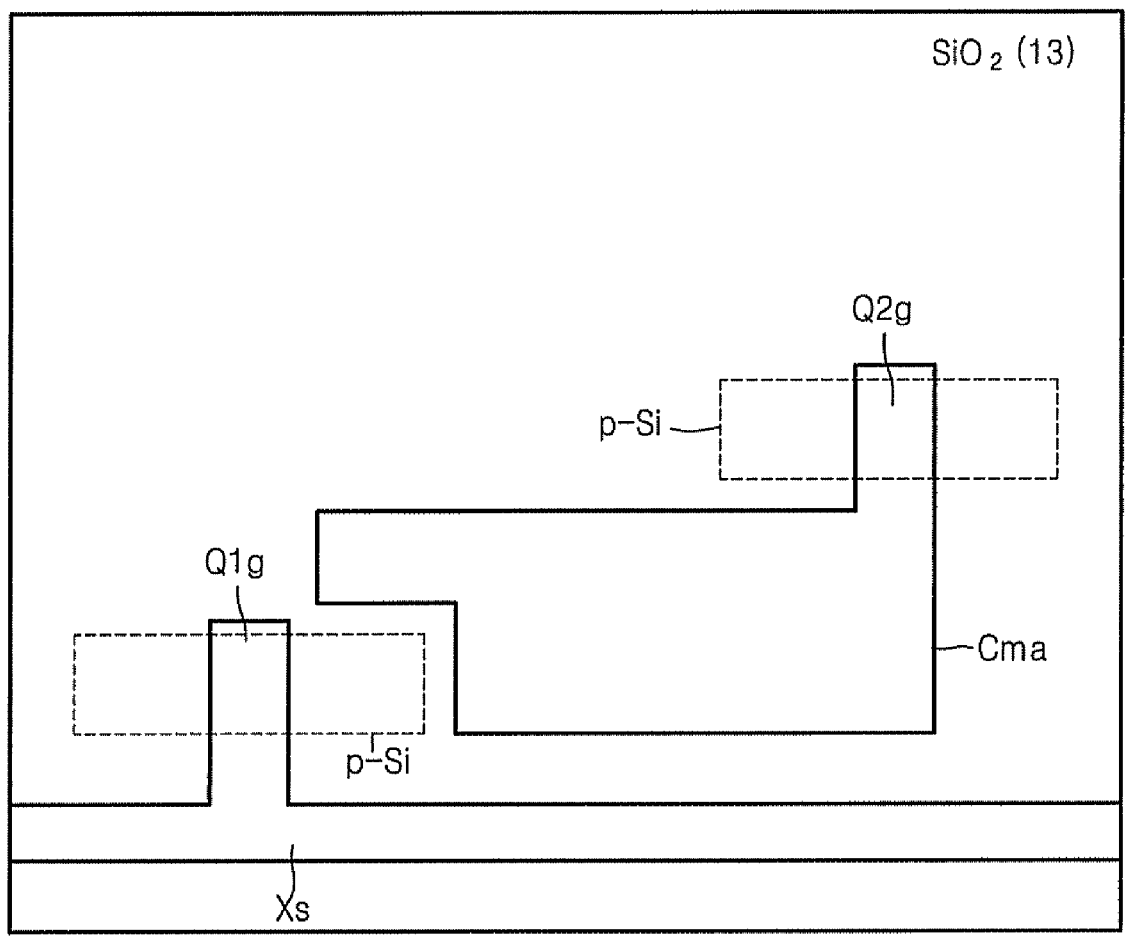

Referring to FIG. 5F, a metal layer is formed of molybdenum (Mo), tungsten (W), or other suitable material using a deposition method, a sputtering method, or other suitable method. Next, the metal layer is patterned by a wet etching method using a photoresist to form an X line Xs, gates Q1g and Q2g and a lower electrode Cma of a memory capacitor, wherein the gate Q1g is connected to the X line Xs, and the gate Q2g is connected to the lower electrode Cma.

Figure 5G:
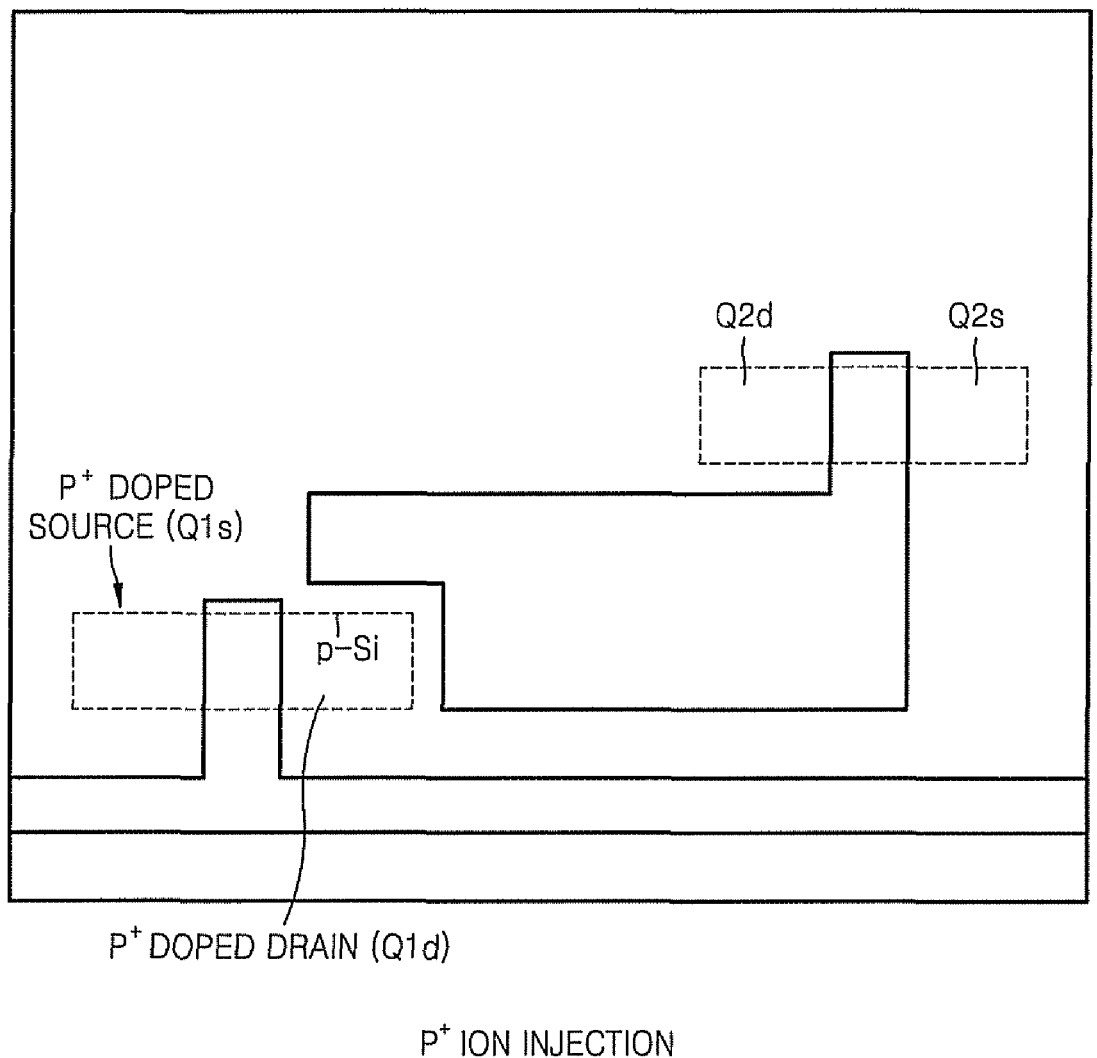

Referring to FIG. 5G, phosphorous (P) ions are injected into both ends of the silicon island 13a' which are not covered with the gate Q1g, using an ion injection method or other suitable method to obtain a source Q1s and a drain Q1d of a switching transistor Q1. P ions are injected into both ends of the silicon island 13b', which are not covered with the gate Q2g, using the ion injection method or other suitable method to obtain a source Q2s and a drain Q2d of a driving transistor Q2.

If the driving transistor Q2 was doped with N-type dopant in a previous process, the N-type dopant is inverted into a P-type dopant with a sufficient doping of P+ ions. After doping is complete, the polycrystalline silicon islands 13a and 13b of the switching transistor Q1 and the driving transistor Q2, respectively, are activated by annealing. In other words, exemplary embodiments use P-type dopants.

Figure 5H:
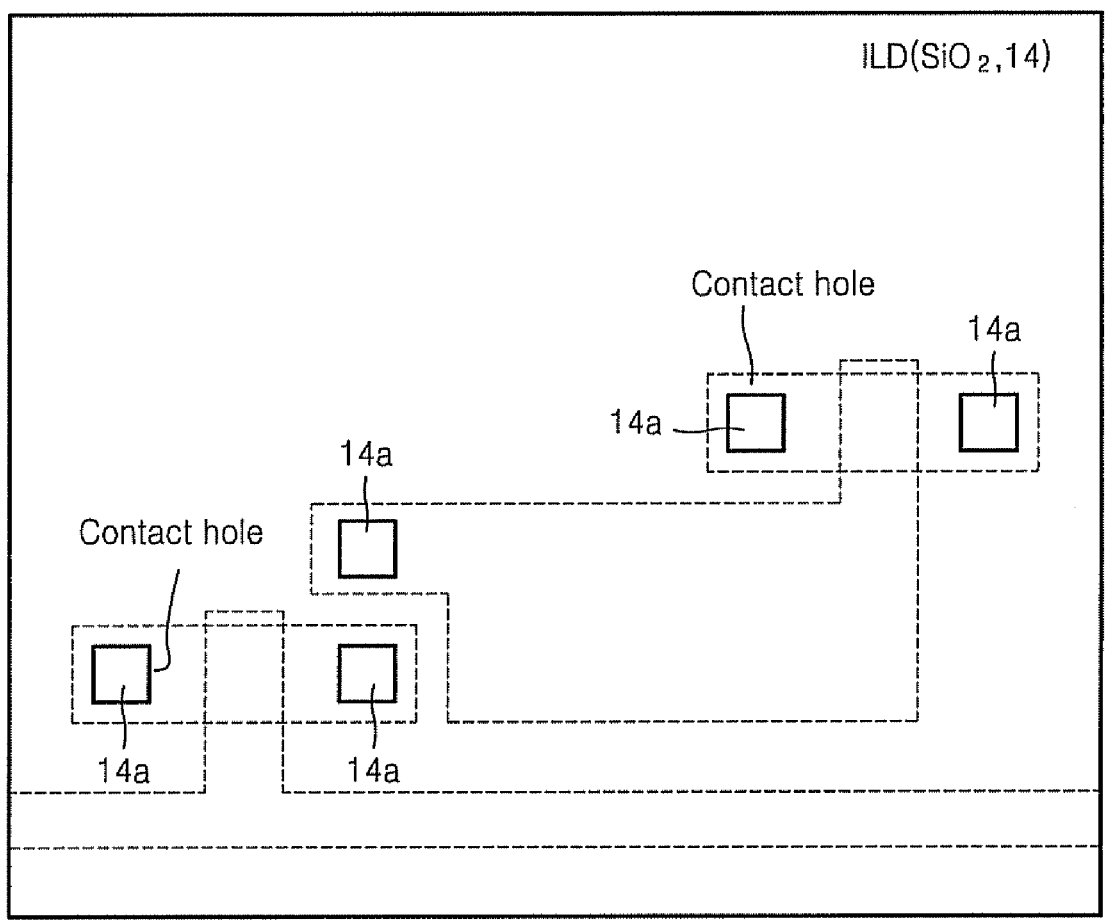

Referring to FIG. 5H, $SiO_2$ is deposited on the resultant structure using CVD or other suitable method to form an interlayer dielectric ("ILD") layer 14. Next, contact holes 14a are formed in the ILD layer 14 to electrically connect the switching transistor Q1 to the driving transistor Q2.

Figure 5I:
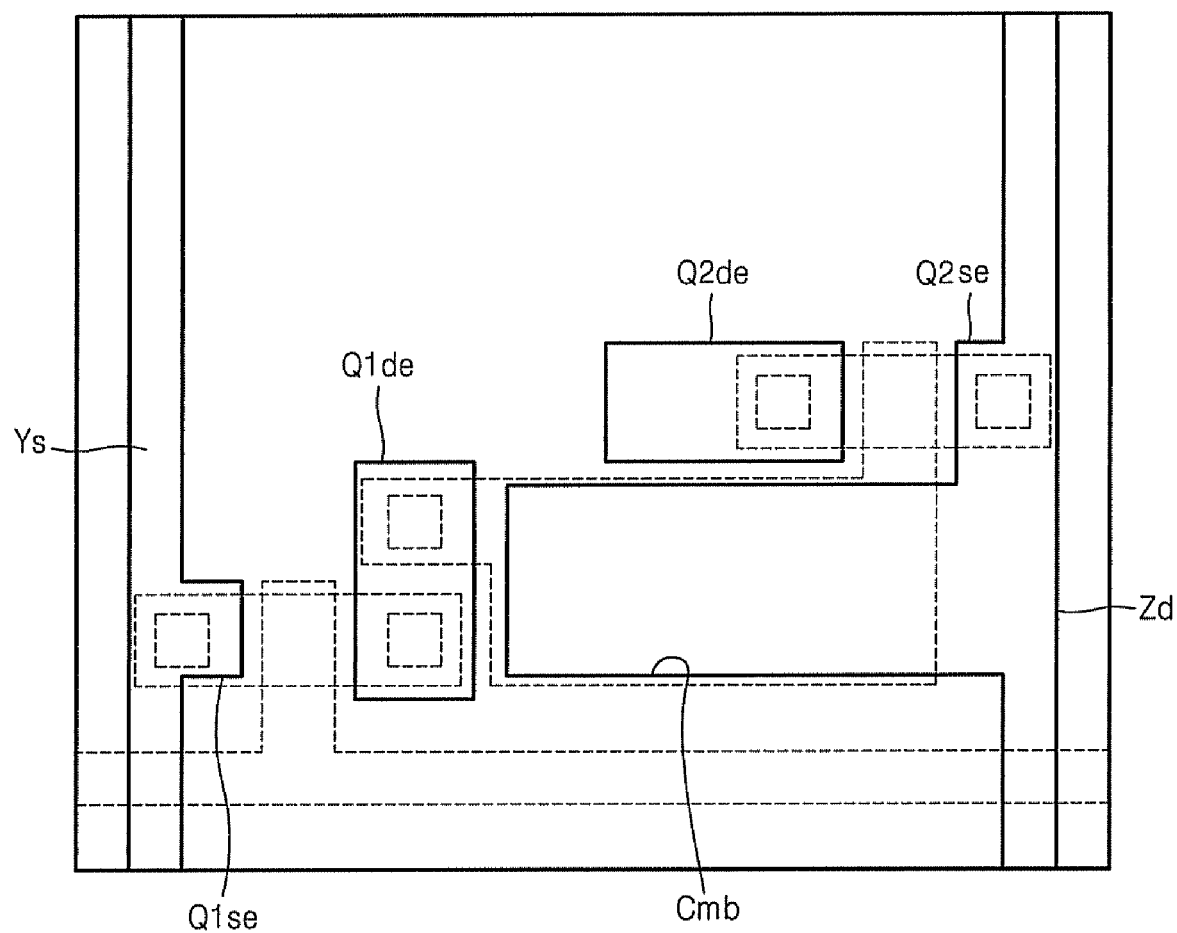

Referring to FIG. 5I, a metal layer is formed on the ILD layer 14 and then patterned to form a Y line Ys, a Z line Zd, a drain electrode Q1de and a source electrode Q1se of the switching transistor Q1, a drain electrode Q2de and a source electrode Q2se of the driving transistor Q2, and an upper electrode Cmb of a memory capacitor Cm.

Figure 5J:
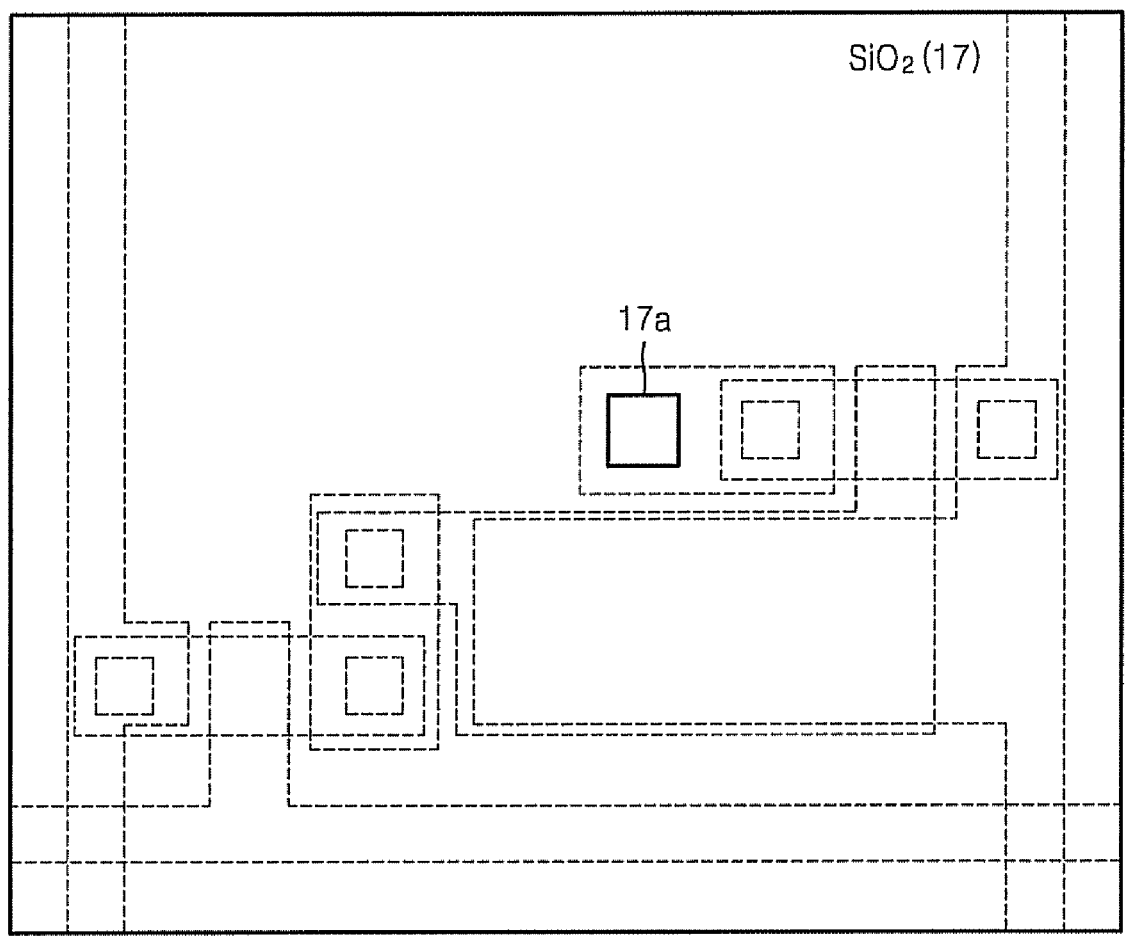

Referring to FIG. 5J, a second insulating layer 17 made of $SiO_2$ is formed on the resultant structure and a contact hole 17a is formed in the second insulating layer 17 to expose the drain electrode Q2de of the driving transistor Q2.

Figure 5K:
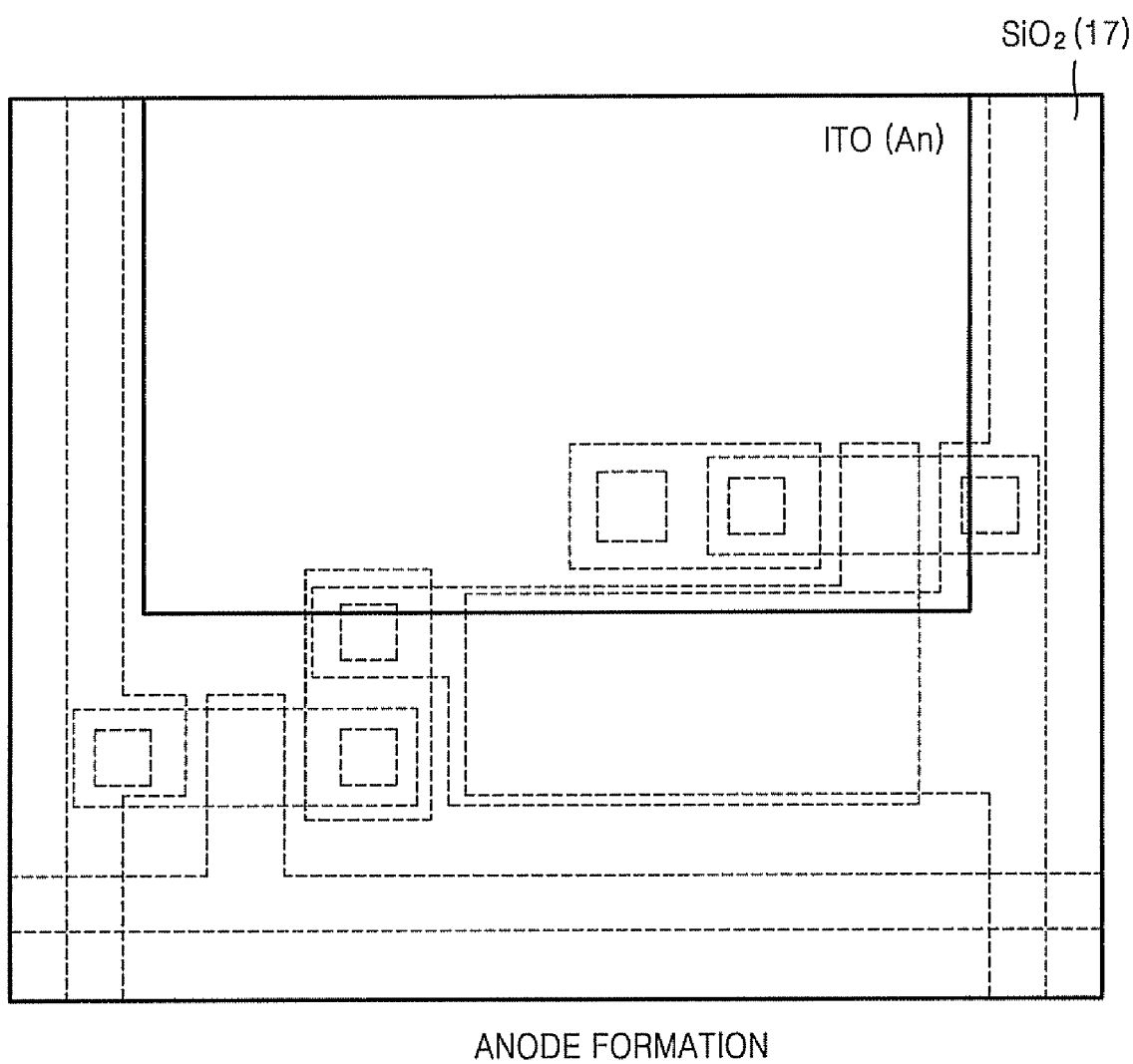

Referring to FIG. 5K, a conductive layer formed of indium tin oxide ("ITO") or other suitable material is formed on the second insulating layer 17 and then patterned to form an anode An of an OLED.

Figure 5L:
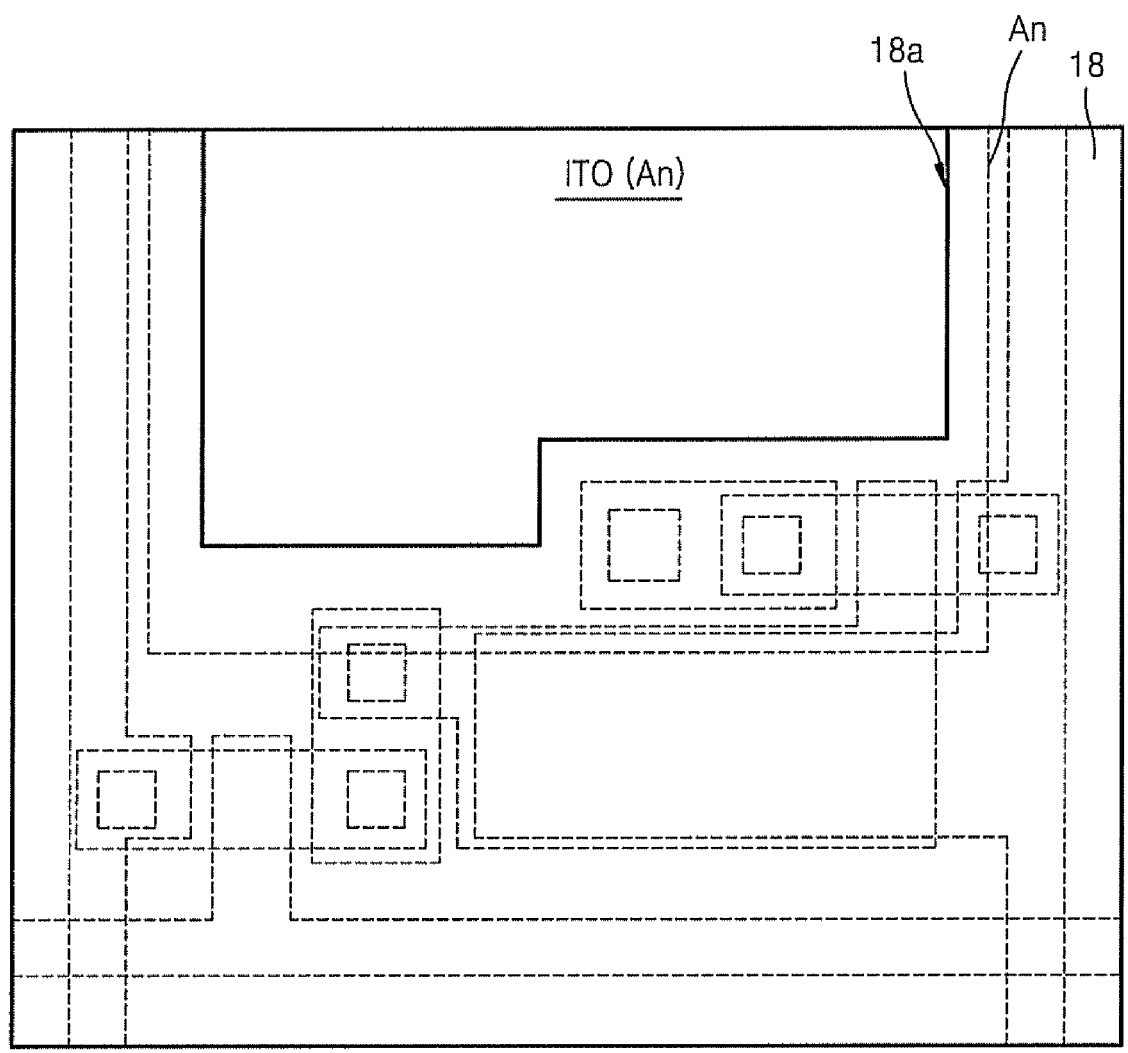

Referring to FIG. 5L, a third insulating layer 18 is formed on the resultant structure, and then a window 18a is formed in the third insulating layer 18 to expose the anode An of the OLED.

Figure 5M:
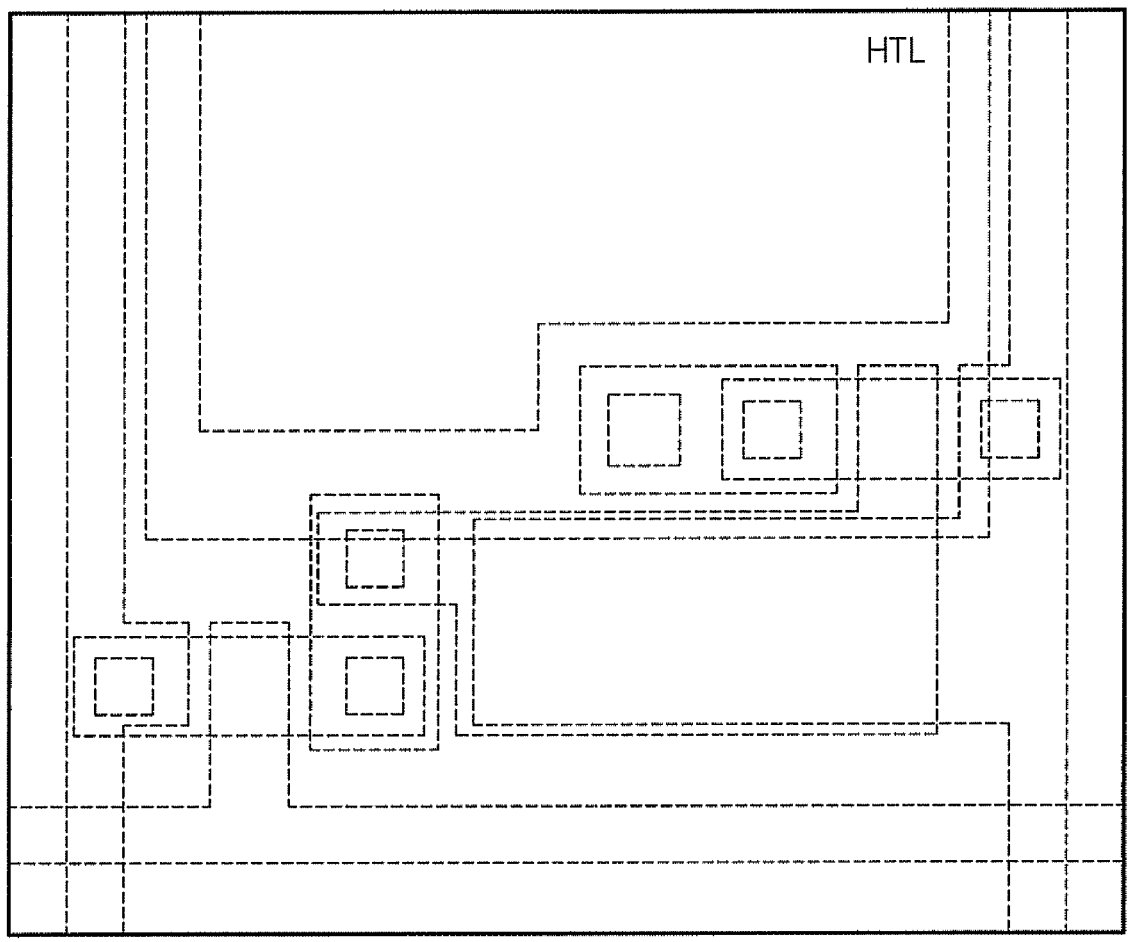

Referring to FIG. 5M, a hole transport layer ("HTL") is formed on the resultant structure.

Figure 5N:
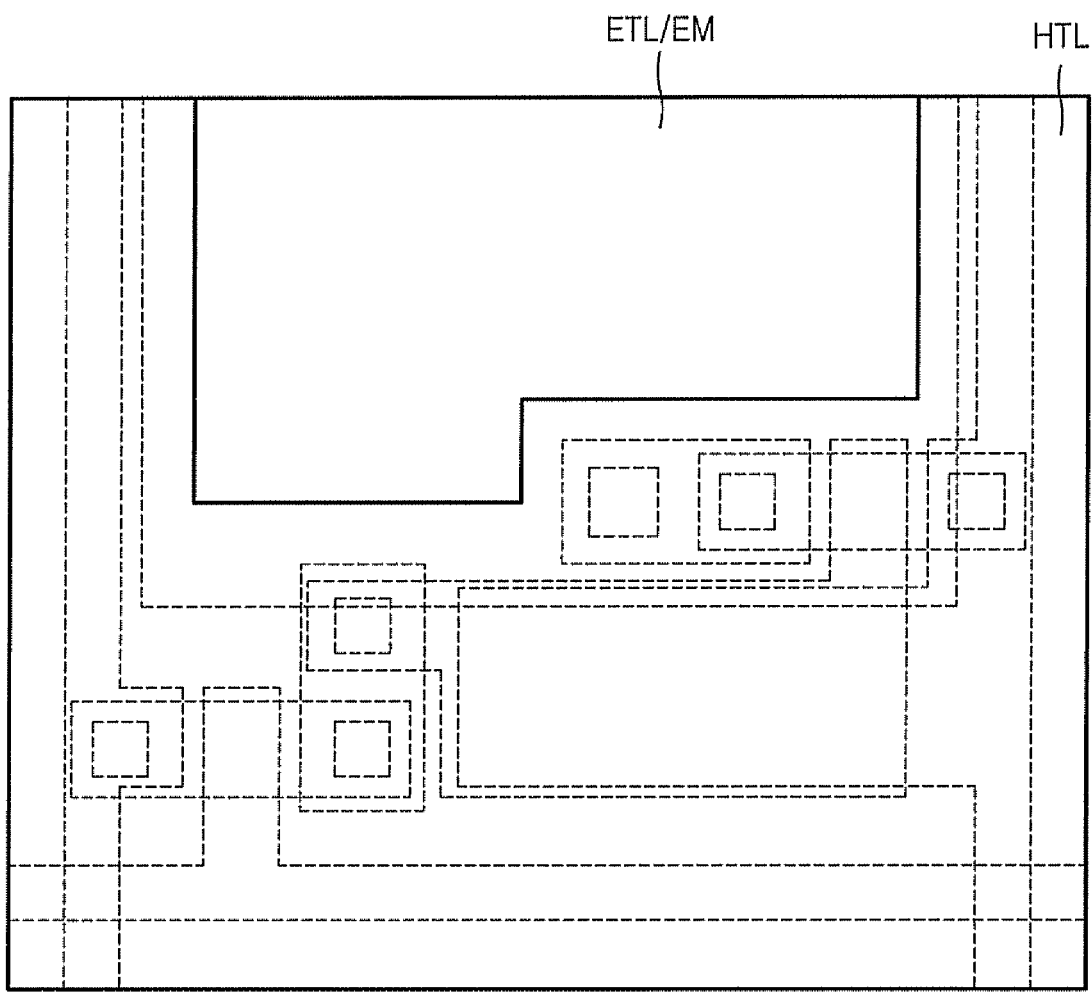
Figure 50:
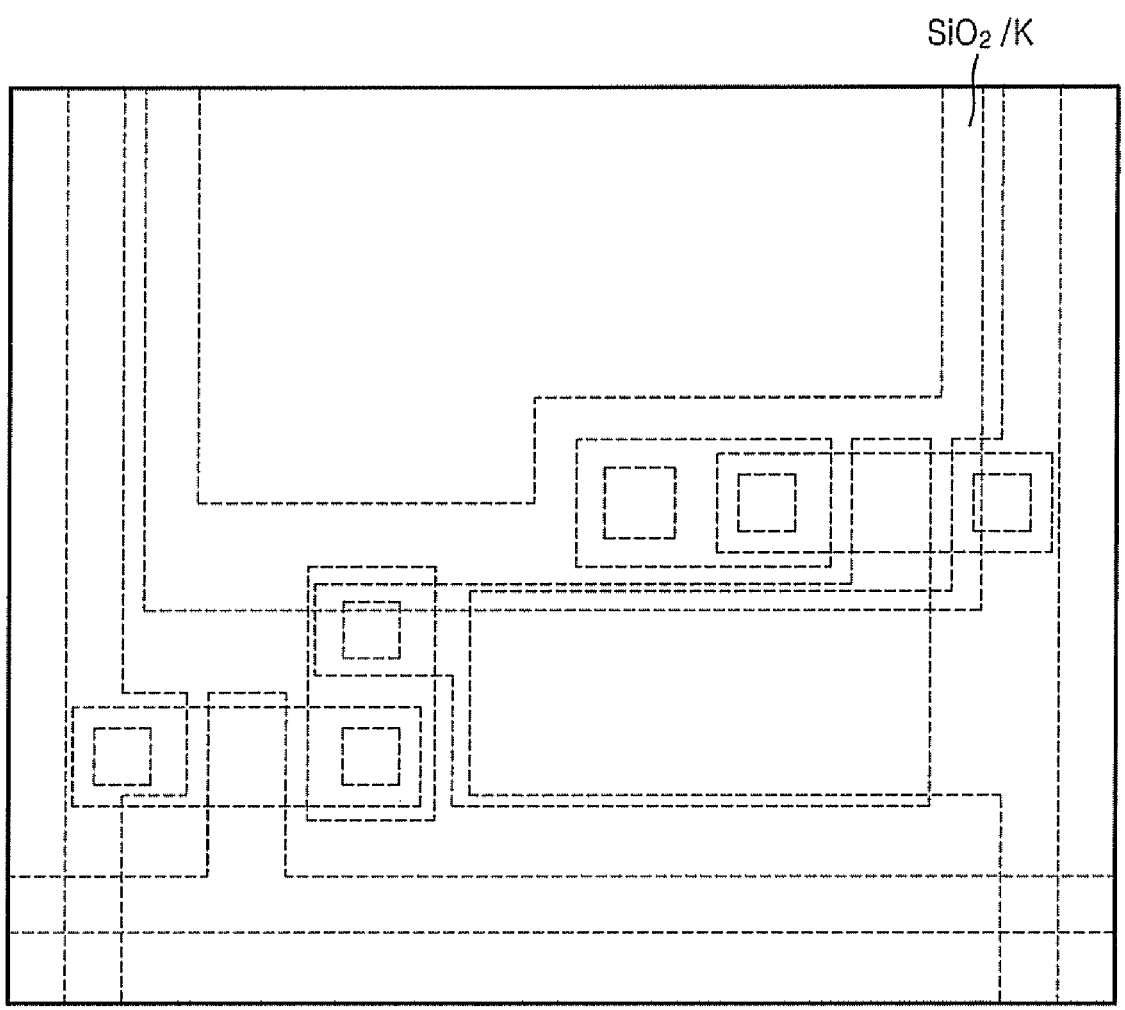

Referring to FIG. 5N, a light emitting layer ("EM") and an electron transport layer ("ETL") are sequentially formed on the HTL.

Referring to FIG. 5O, a common electrode K as a cathode of the OLED is formed on the resultant structure including the ETL, and a fourth insulating layer 19 is formed on the common electrode K.

In summary, a process of fabricating two transistors having different grain sizes and a capacitor on a substrate for the purpose of driving pixels of an organic electro-luminescent display has been described. The organic electro-luminescent display as described according to one exemplary embodiment of the present invention adopts a top gate type TFT. Alternatively, another exemplary embodiment of the present invention may adopt a bottom gate type TFT in which an active layer is positioned under a gate. A structure of the bottom gate type TFT and a method of fabricating the bottom gate type TFT may be realized easily and thus does not limit the spirit and scope of the present invention as defined by the following claims.

As described above, an organic electro-luminescent display according to the present invention can be designed so as to satisfy requirements of switching and driving transistors. In other words, polycrystalline silicon islands having different grain sizes can be obtained. Thus, a low mobility active layer and a switching transistor having a low leakage current due to the low mobility active layer and a high mobility active layer and a driving transistor having a fast response driving current due to the high mobility can be fabricated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating an organic electro-luminescent display comprising a driving transistor which drives an organic light emitting diode and a switching transistor which drives the driving transistor, the method comprising:
    forming an amorphous silicon layer on a substrate;
    forming silicide having a relatively lower density in an area corresponding to the driving transistor than in an area corresponding to the switching transistor on the amorphous silicon layer;
    crystallizing the amorphous silicon layer using the silicide to form a polycrystalline silicon layer having a relative larger grain size in the area corresponding to the driving transistor than in the area corresponding to the switching transistor;
    patterning the polycrystalline silicon layer to form silicon islands corresponding to active layers of the switching and driving transistors; and
    fabricating the switching and driving transistors using the silicon islands.

2. The method of claim 1, wherein the formation of the silicide comprises:
    forming a capping layer on the amorphous silicon layer to cover at least the area corresponding to the driving transistor;
    adhering metal particles to the resultant structure;
    diffusing the metal particles into the amorphous silicon layer using annealing to form the silicide; and
    crystallizing the amorphous silicon layer using the silicide.

3. The method of claim 2, wherein the capping layer covers the areas corresponding to the switching and driving transistors and is thicker in the area corresponding to the driving transistor than in the area corresponding to the switching transistor.

4. The method of claim 1, wherein the silicide is formed of nickel.

5. The method of claim 2, wherein the silicide is formed of nickel.

6. The method of claim 3, wherein the silicide is formed of nickel.

* * * * *